United States Patent [19]

Perrigo

[11] Patent Number: 4,592,444

[45] Date of Patent: Jun. 3, 1986

[54] LOW FREQUENCY SPEAKER ENCLOSURE

[76] Inventor: Stephen M. Perrigo, 15610 SE. Tong Rd., Clackamas, Oreg. 97015

[21] Appl. No.: 718,981

[22] Filed: Apr. 2, 1985

Related U.S. Application Data

[63] Continuation-in-part of Ser. No. 470,792, Feb. 28, 1983, Pat. No. 4,524,845.

[51] Int. Cl.[4] .................................................. H05K 5/00

[52] U.S. Cl. .................................... 181/151; 181/152; 181/199

[58] Field of Search ......... 181/152, 159, 151, DIG. 1, 181/144, 145, 192, 194, 193, 195, 146, 182, 183, 187, 160, 189, 190, 156, 199

[56] References Cited

U.S. PATENT DOCUMENTS

| | | | |
|---|---|---|---|
| 2,975,852 | 3/1961 | Chave | 181/155 |
| 3,443,660 | 5/1969 | Virca et al. | 181/153 X |
| 3,867,996 | 2/1975 | Lou | 181/148 |
| 3,909,531 | 9/1975 | Plummer | 179/1 E |
| 3,962,544 | 6/1976 | Kobayashi | 179/1 E |
| 3,982,607 | 9/1976 | Evans | 181/152 |
| 4,057,689 | 11/1977 | Stallings, Jr. | 179/1 E |
| 4,213,008 | 7/1980 | Helfrich | 179/1 E |
| 4,213,515 | 7/1980 | Laupman | 181/145 |
| 4,325,454 | 4/1982 | Humprey | 181/145 |

*Primary Examiner*—L. T. Hix
*Assistant Examiner*—Brian W. Brown
*Attorney, Agent, or Firm*—Henderson & Sturm

[57] ABSTRACT

This invention relates to low-frequency speaker enclosures in general, and more specifically to dual cabinet construction, wherein each of the cabinet structures contains a portion of a pre-formed generally semi-circular variable diameter horn passageway, surrounded by contoured foam elements that provide sound insulation for the horn passageway wherein the pre-formed horn passageway produces redirection and amplification of rear-cone sound wave energy, through the forward face of the combined cabinet construction.

5 Claims, 4 Drawing Figures

LOW FREQUENCY SPEAKER ENCLOSURE

BACKGROUND OF THE INVENTION

This application is a continuation-in-part application of copending U.S. patent application Ser. No. 470,792 filed Feb. 28, 1983, now U.S. Pat. No. 4,524,845 and entitled Low Frequency Speaker Enclosure.

The prior art is replete with speaker enclosure constructions, which are designed to alter the direction of rear-cone sound waves emminating from the speaker element, as can be seen by reference to the following patents:

U.S. Pat. No. 3,962,544 discloses a dual speaker enclosure, which is designed to direct rear-cone radiation out the sides of the enclosure, to improve radiation effeciency and transient response.

U.S. Pat. No. 3,909,531 provides a rectangular cavity for the midrange speaker, with a forward facing enclosure opening, that houses the tweeter speaker.

U.S. Pat. No. 4,213,008 discloses an interior rearwardly facing horn, which directs the rear-cone sound downwardly and rearwardly through an expanding horn opening. This horn body is formed by the exterior walls of the cabinet and large rectangular slats.

U.S. Pat. No. 4,325,454 discloses a speaker system that inverts and redirects the speaker backwave out of the cabinet, by directing the sound wave against a slant board and thence through an enlarged triangular opening.

U.S. Pat. No. 4,213,515 discloses a speaker enclosure, which has at least one passageway leading from the interior of the enclosure, to the front and rear of this passageway to be one and one half times larger than the central section of the passageway. In addition, the interior cavity, that forms part of the passageway from the rear of the speaker to the face of the cabinet, is provided with sharp edges on opposing wall surfaces, that will have a deleterious effect on the sound waves emminating from the rear of the speaker.

While all of the aforementioned prior art devices have the same ultimate goal (i.e., the redirection of rear-cone sound waves) their results have been as diverse as their proposed solutions to the problem.

The present invention accomplishes this end, with minimum distortion, maximum amplification, and a strong sound wave dispersion at the outlet of the horn.

SUMMARY OF THE INVENTION

An object of the present invention is to provide a low frequency speaker enclosure, that will redirect rear-cone sound waves to the front of the enclosure with minimum sound wave distortion.

Another object of the present invention is to provide an internal enclosure construction, that will have a pre-formed horn passageway amplifying and directing low frequency sound waves, from the front of the enclosure cabinet.

Still another object of the present invention is to provide a foamed sectional internal enclosure construction, that will provide support for the exterior walls of the enclosure, in addition to suspending and supporting the pre-formed horn passageway.

A further object of the present invention is to provide an enclosure construction, wherein sectional interior foamed elements occupy all of the interior cabinet space, with the exception of the pre-formed sound transmitting passageway.

Yet another object of the present invention is the provision of a low frequency speaker interior enclosure construction, to produce phase inversion, as opposed to using inner cabinet baffling and cabinet walls, to amplify the sound pressure levels and tonal qualities of the speaker element.

A yet further object of the present invention is to provide an internal horn passageway within a speaker enclosure, that produces very little sound wave energy loss, due to sound wave reflection from angular surfaces found in the prior art horn construction.

Another object of the present invention is the provision of a foam support for the horn passageway which isolates the cabinet walls from the sound wave energy transmitted through the horn passageway.

These and other objects, advantages and novel features of the invention will become apparent from the detailed description that follows, when considered in conjunction with the accompanying drawings.

DETAILED DESCRIPTION OF THE PREFERRED EMBODIMENT

Figure 2:
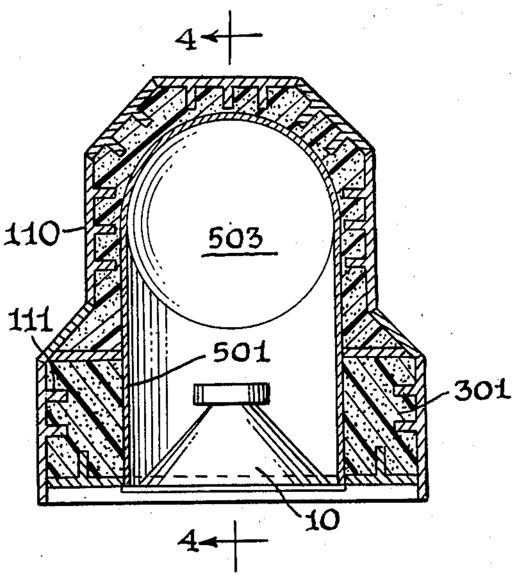
FIG. 2 is a top cross-sectional view of the upper segment of the speaker enclosure.

The low frequency speaker enclosure, which forms the basis of the present invention, comprises in general; a speaker element 10; and upper 100 and lower 200 cabinet structure; and an internal enclosure member 300 surrounding a pre-formed horn passageway member 500.

The upper cabinet structure 100 comprises a plurality of side panels 110, an apertured bottom panel 120, a top panel 130, an apertured face panel 140, and a rear panel which forms the upper cabinet external enclosure.

The lower cabinet structure 200 comprises a plurality of side panels 210, a bottom panel 220, an apertured top panel 230, an apertured face panel and a rear panel 260 which form a lower cabinet external enclosure.

Figure 1:
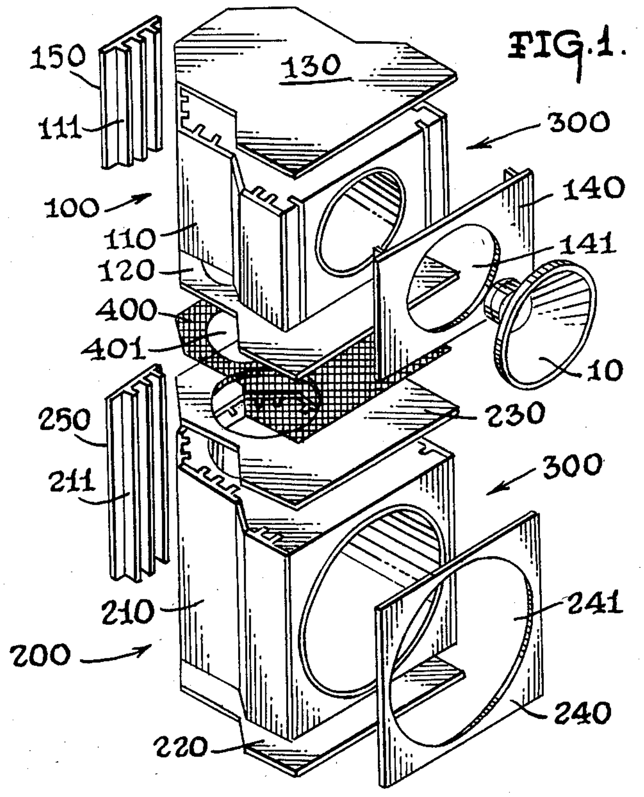
FIG. 1 is an exploded perspective view of the foamed cabinet enclosure interior, the pre-formed horn passageway the associated cabinet structure for the low frequecy speaker assembly.

While the upper and lower cabinet structure as illustrate in FIGS. 1 and 2 are contoured, it is to be understood that the external configuration of the cabinet structures do not form a part of this invention, and any aesthetically pleasing geometric or non-geometric cabinet configuration may be employed. All of the panels likewise may be fabricated from wood, chipboard, plastic or other suitable rigid material.

Figure 3:
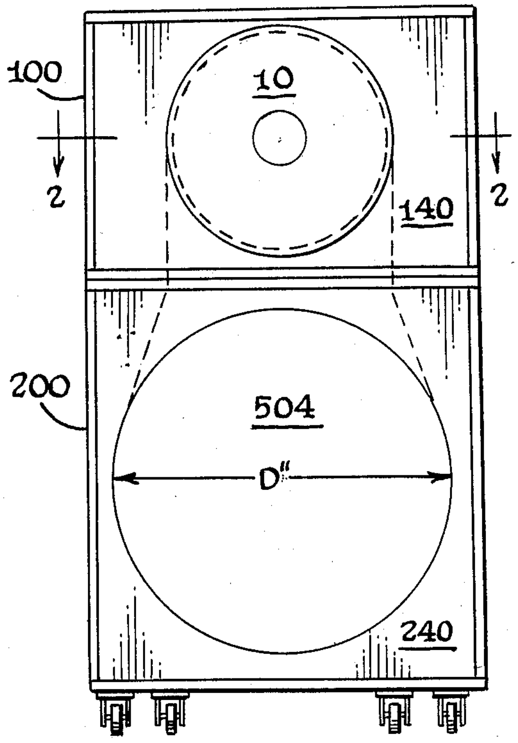
FIG. 3 is a front elevation view of the speaker enclosure.

As best can be seen by reference to FIGS. 1 thru 3, the side panels 110 and 210 are further provided with stiffening ribs 111 and 211 respectively, which are intended to provide rigidity and support to the cabinet structures. In addition, both of the cabinet structures may optionally be provided with apertured internal partition members 150 and 250 respectively, which would divide the interiors of the upper and lower cabinet structures into front and rear compartments. The partition members 150, 250 would only be provided in certain instances to the cabinet structures when necessary.

Figure 4:
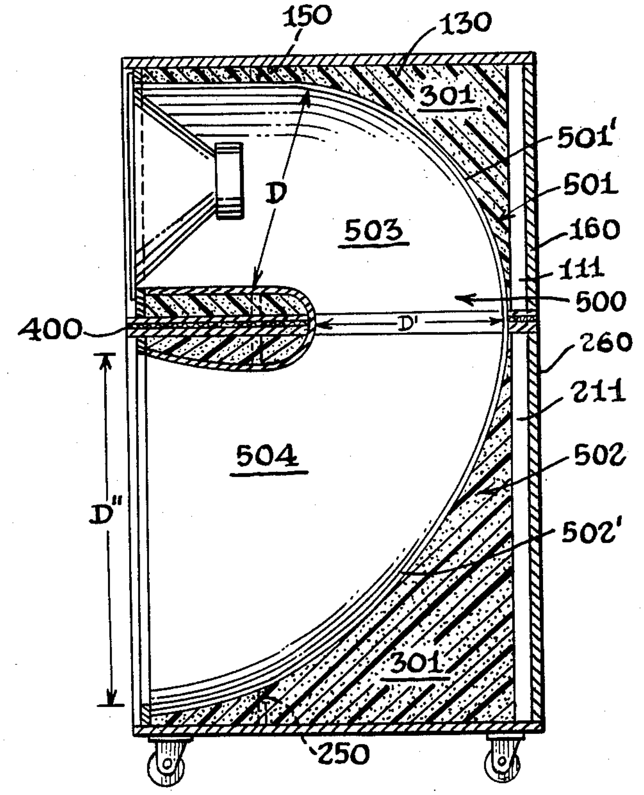
FIG. 4 is a side cross-sectional view of the enclosure, showing the disposition of the horn configuration with respect to the other structural components of the assembly.

As can best be seen by reference to FIG. 4, the pre-formed horn passageway member 500 comprises a generally constant diameter upper horn passageway portion 501 in the upper cabinet structure 100, and a gradually increasing diameter lower horn passageway portion 502 in the lower cabinet structure 200. In the preferred embodiment of this invention depicted in the drawings, both the upper 501 and lower 502 horn passageway portions comprise pre-formed thin walled molded fiberglass inserts 501' and 502', having a smooth interior finish to promote maximum sound amplification with minimum sound distortion.

As shown in FIG. 4, the upper fiberglass insert 501', that forms the upper horn passageway portion 501, defines an opening 503 having a generally constant diameter D; wherein, the opening 503 extends from the face panel 140 to the bottom panel 120 and transcribes an arc of 90 degrees.

As can also be seen in FIG. 4, the lower fiberglass insert 502', that forms the lower horn passageway portion 502, defines an opening 504; wherein, the opening 504 transcribes an arc of 90 degrees, and extends from the top panel 230 to the face panel 240 of the lower cabinet structure 200.

As mentioned previously the lower cabinet structure 200 has a gradually increasing diameter horn passageway portion 502; wherein the smaller diameter opening D' is disposed proximate the internal terminus of the generally constant diameter opening D in the upper cabinet structure, and wherein the values of D and D' are approximately equal. In addition, the larger diameter opening D'' is disposed proximate the face panel 240 in the lower cabinet structure 200, and the value of D'' is substantially greater than the value of either D or D'.

In order that the horn passageways 501 and 502 are acoustically isolated from the exterior walls of the respective cabinet sections, and in order that the inserts 501' and 502' are supported and suspending within the interior of the respective cabinet sections a filler material designated generally as 300 is introduced into the cabinet sections during the assembly thereof.

In the preferred embodiment, the filler material 300 comprises a polyurethane foam 301 that is introduced into the respective cabinet sections prior to final assembly, wherein the foam 301 expands and fills the voids between the inserts and the cabinet, whereby the foam 301 encapulates the exterior surfaces of the inserts 501' and 502' and conforms itself to the interior dimensions of the cabinet structures.

An example of one proposed method of fabrication will be described herein with respect to the upper cabinet structure 100. It being understood that virtually the same method would be employed in the fabrication of the lower cabinet structure with only minor variations. To begin with the upper end of the fiberglass insert 501' is installed in the apertured face panel 140 whereby the upper end of the insert 501' is flush with the enlarged aperture 141 in the face panel 140. The lower end of the fiberglass insert 501' is then installed in a like manner with respect to the apertured bottom panel 120. Then the side panels 110 and top panels 130 are joined together, leaving the rear panel 160 unattached at this point.

At this point the polyurethane foam 301 would be introduced into the partially assembled upper cabinet structure 100 and allowed to expand until it occupied the interior volume defined by the assembled panels. Once the foam 301 had cured, the portion of the foam, that projected outside the cabinet enclosure, would be trimmed off and the rear panel 160 would be installed to complete the upper cabinet structure assembly.

It should be appreciated at this juncture that there are myriad ways of assembling or fabricating the finished structure in question and the aforementioned description has merely been offered as an example of one conceivable method.

Prior to assemblying the upper and lower cabinet structures together to form the low-frequency speaker enclosure, an apertured resilient sealing element 400, preferably in the form of a rubber mat 401, is interposed between the respective cabinet structures to dampen any vibration therebetween. Suitable securing means (not shown) are provided to secure the cabinet structures together to complete the assembly.

It should be appreciated at this point that a low frequency speaker 10 mounted in the front of the upper cabinet structure 100 will re-direct the rear-cone sound waves from the speaker along a smooth surfaced generally constant diameter tube horn. The sound waves will experience minimum distortion, maximum amplification, and will project a long strong sound wave dispersion as they leave the forward end of the lower cabinet structure 200.

In addition, the foam 301 that surrounds the performed horn passageway 500, not only will isolate the sound waves from the reflections from baffles that conventional enclosures experience; but will also eliminate the need for inner cabinet bracing, since the lightweight foam becomes essentially an integral part of the inner cabinet structure and reduces the overall weight of the finished product. Furthermore, the tube horn passageway produces a high sound pressure level, which is required by bands during on-stage performances, where a long sound projecting dispersion is necessary.

Having thereby disclosed the subject matter of this invention, it should be obvious that many substitutions, modifications, and variations of the invention are possible in light of the above teachings. It is therefore to be understood that the invention as taught and described is only to be limited to the extent of the breadth and scope of the appended claims.

What I claim:

1. An improved low frequency speaker enclosure comprising:

an upper cabinet structure comprising an apertured front panel, an apertured bottom panel, and a generally constant diameter tube horn passageway formed between said front panel and said bottom panel by a first pre-formed fiberglass insert;

a lower cabinet structure comprising an apertured front panel, an apertured top panel, and a generally increasing diameter tube horn passageway formed between said top panel and said front panel by a second formed fiberglass insert; and a low frequency speaker mounted in the apertured face panel of the upper cabinet structure.

2. An improved low frequency speaker enclosure as in claim 1 wherein the upper cabinet enclosure further comprises:

a top panel, a plurality of side panels, and a rear panel.

3. An improved low frequency speaker enclosure as in claim 2 wherein the lower cabinet enclosure further comprises:

a bottom panel, a plurality of side panels, and a rear panel.

4. An improved low frequency speaker enclosure as in claim 3 wherein the interiors of said upper and lower cabinet structures surrounding the respective first and second fiberglass inserts are occupied by a filler material.

5. An improved low frequency speaker enclosure as in claim 4 wherein said filler material is polyurethane foam.

* * * * *